United States Patent
Gris

(10) Patent No.: US 6,376,322 B1
(45) Date of Patent: *Apr. 23, 2002

(54) BASE-EMITTER REGION OF A SUBMICRONIC BIPOLAR TRANSISTOR

(75) Inventor: Yvon Gris, Tullins (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,028

(22) Filed: Mar. 30, 1999

(30) Foreign Application Priority Data

Mar. 31, 1998 (FR) .............................. 98 04206

(51) Int. Cl.$^7$ ..................... H01L 21/331; H01L 21/8222
(52) U.S. Cl. ....................... 438/309; 438/365; 438/370; 438/373
(58) Field of Search .................. 438/309, 364–366, 438/368–377

(56) References Cited

U.S. PATENT DOCUMENTS 5,010,026 A * 4/1991 Gomi ........................... 437/31
5,023,192 A * 6/1991 Josquin et al. .................. 437/31
5,489,541 A * 2/1996 Yang et al. .................... 437/31

FOREIGN PATENT DOCUMENTS

EP A-0 746 032 12/1996 ............ H01L/27/06
EP A-0 766 295 4/1997 ............ H01L/21/33

OTHER PUBLICATIONS

French Search Report from French Patent Application 98/04206, filed Mar. 31, 1998.
Ehinger K., et al.: "Narrow BF2 Implanted Bases For 35 GHZ/24 PS High–Speed SI Bipolar Technology" Proceedings Of The International Electron Devices Meeting, Washington, Dec. 8–11, 1991, pp 91–459–462.

* cited by examiner

Primary Examiner—Olik Chaudhuri
Assistant Examiner—Hoai Pham
(74) Attorney, Agent, or Firm—Wolf, Greenfield & Sacks, P.C.; James H. Morris

(57) ABSTRACT

The present invention relates to a method of manufacturing the base and emitter regions of a bipolar transistor, including the steps of depositing a first heavily-doped P-type polysilicon layer; eliminating the first polysilicon layer in its central portion; growing a thermal oxide layer; performing a P-type implantation at a first dose; forming silicon nitride spacers at the internal periphery of the first layer; performing a second P-type implantation at a second dose; eliminating the central oxide layer; depositing a second N-type polysilicon layer; and performing a fast thermal anneal; the second dose being selected to optimize the characteristics of the base-emitter junction and the first dose being smaller than the second dose.

29 Claims, 3 Drawing Sheets

BASE-EMITTER REGION OF A SUBMICRONIC BIPOLAR TRANSISTOR

BACKGROUND OF THE INVENTION

1. Field of the Invention

The present invention relates to the manufacturing of a bipolar transistor in a BICMOS integrated circuit manufacturing technology incorporating, in particular, bipolar components and complementary MOS (CMOS) components.

The present invention more specifically relates to such a technology in which the dimensions of an element patterned on a mask may be lower than or equal to 0.4 µm, for example, from 0.2 to 0.35 µm.

2. Discussion of the Related Art

A BICMOS-type technology to which the present invention applies is described in French patent numbers No96/14408, No96/14409, No96/14410, No96/14411, No96/14412, all filed Nov. 19, 1996, number No96/16065, filed Dec. 20, 1996, number No96/16337, filed Dec. 27, 1996, and number No98/01313, filed Jan. 30, 1998. All of these applications are incorporated herein by reference.

The structure of a bipolar transistor in such a technology will be explained hereafter, in relation with the simplified cross-sectional views of FIGS. 1 to 4.

As illustrated in FIG. 1, the structure is formed in a P-type substrate 1 including a buried layer 2 of type N$^+$ over which is formed an N-type lightly-doped epitaxied layer 3. An active area is delimited by an oxide region 4. Above the active area, a P-type doped polysilicon layer 6 and a protection oxide layer 7 are successively deposited. Layers 6 and 7 are altogether opened at the level of the central portion of the active area. It should be noted that, upon etching of layers 6 and 7, the apparent upper surface of epitaxial layer 3 is inevitably slightly dug in. After this, a thermal oxidation is performed to form a thin oxide layer 8, having for example a thickness of approximately 5 nm on the sides of polysilicon layer 6 and on the surface of the central area of the epitaxial layer. During this step, the P-type dopants contained in polysilicon 6 diffuse in epitaxial layer 3 to form an extrinsic base region 10. Then, a P-type dopant, for example, boron, is implanted, the implanted area, marked with crosses, being designated with reference 11. Further, prior to the boron implantation, a very high energy N-type implantation is performed to form a lower collector region 12 more heavily doped than epitaxial layer 3.

Conventionally, the collector contact is recovered by an N$^+$-type diffused region, not shown, contacting buried layer 2 and extending up to the surface. This collector structure will not be shown and described in the following description, given that it is a conventional structure.

At the following step, illustrated in FIG. 2, compound spacers are formed. These spacers are formed by depositing a thin silicon nitride layer followed by a polysilicon layer. After anisotropically etching the polysilicon, there only remain polysilicon spacers 14. After this, the silicon nitride is etched and there only remain portions of silicon nitride 15 under the polysilicon.

The advantage of forming such compound spacers with respect to the conventional forming of oxide spacers or nitride spacers is that good insulation is obtained, and that it is possible to define very precise dimensions. The width of the compound spacers is essentially determined by the polysilicon thickness. The polysilicon etching is performed by plasma with a stop on the nitride layer which has for example a 30-nm thickness. The nitride etching is performed chemically with a stop on the oxide layer. The selectivity being extremely high, oxides 7 and 8 are not consumed. The etching of the silicon oxide is then performed chemically and induces no silicon consumption. After this step, a heavily-doped N-type polysilicon layer 19 is deposited, this layer being preferably coated with a silicon oxide layer 19. The structure illustrated in FIG. 3 is thus obtained.

Then, a fast thermal anneal is performed, for example, at 1040° C. for a duration of 40 s to obtain a diffused structure of the type illustrated in FIG. 4. An emitter region 20 diffused from polysilicon 18 and formed in a P-type base region resulting from the diffusion of implanted area 11 is thus obtained. Considering the base in more detail, it can be divided into three regions, extrinsic base region 10 resulting from the diffusion from P-type doped polysilicon 6, an intrinsic base region 22 under emitter region 20 and an intermediary region 24 between the intrinsic and extrinsic base regions, under the compound spacer.

A priori, intermediary region 24 could have been expected to diffuse like intrinsic region 22 since both regions result from the same implantation 11. In fact, region 24 appears to diffuse much less deeply and thus remains more concentrated. Various reasons may be found to explain this phenomenon most likely to be linked to the presence of silicon nitride spacer 14 above region 24. This could seem favorable since the relatively high doping level of region 24 with respect to region 22 tends to reduce the resistance of access to the base, However, given the very small dimensions of a component according to the present invention, the homogeneous lateral extent of region 24 is in practice on the order of 50 to 80 nm only and its resistance is anyway small compared to that of the other stray resistive elements of the structure. Conversely, the fact that a region of greater doping density is located in the vicinity of the edge of junction 20 tends to deteriorate the forward current-voltage characteristics of the base-emitter junction, and thus to reduce the transistor gain.

SUMMARY OF THE INVENTION

An object of the present invention is to provide a modified method of manufacturing improving the characteristics of the emitter-base junction of a bipolar transistor.

Another object of the present invention is to provide such a modified method which does not increase the number of masking and etching steps with respect to the prior art method.

To achieve these and other objects, the present invention provides a method of manufacturing the base and emitter regions of a bipolar transistor in an active area of a first conductivity type, including the steps of depositing a first heavily-doped polysilicon layer of the second conductivity type; eliminating the first polysilicon layer in its central portion; growing a thermal oxide layer; performing an implantation of the second conductivity type at a first dose; forming silicon nitride spacers at the internal periphery of the first polysilicon layer; performing a second implantation of the second conductivity type at a second dose; eliminating the central oxide layer; depositing a second polysilicon layer of the first conductivity type, and performing a fast thermal anneal; in which the second dose is selected to optimize the characteristics of the base-emitter junction and the first dose is smaller than the second dose.

According to an embodiment of the present invention, the first conductivity type is type N and the second conductivity type is type P.

According to an embodiment of the present invention, the first dose results from a boron ($B^{11}$) implantation and the second dose results from a boron fluoride ($BF_2$) implantation.

According to an embodiment of the present invention, the first implantation is performed at a dose from 0.7 to 1 $10^{13}$ at./cm$^2$ under a 5 keV energy and the second implantation is performed at a dose on the order of 3 to 5 $10^{13}$ at./cm$^2$ under a 25 keV energy.

The present invention also provides a bipolar transistor, the base region of which includes a first central portion of a first doping level; a first peripheral portion of a second doping level; a second peripheral portion of a third doping level, in which the second doping level is smaller than the first level, itself smaller than the third level.

According to an embodiment of the present invention, the first peripheral region is arranged under a nitride spacer.

The foregoing objects, features and advantages of the present invention, will be discussed in detail in the following non-limiting description of specific embodiments in connection with the accompanying drawings.

DETAILED DESCRIPTION

Figure 1:
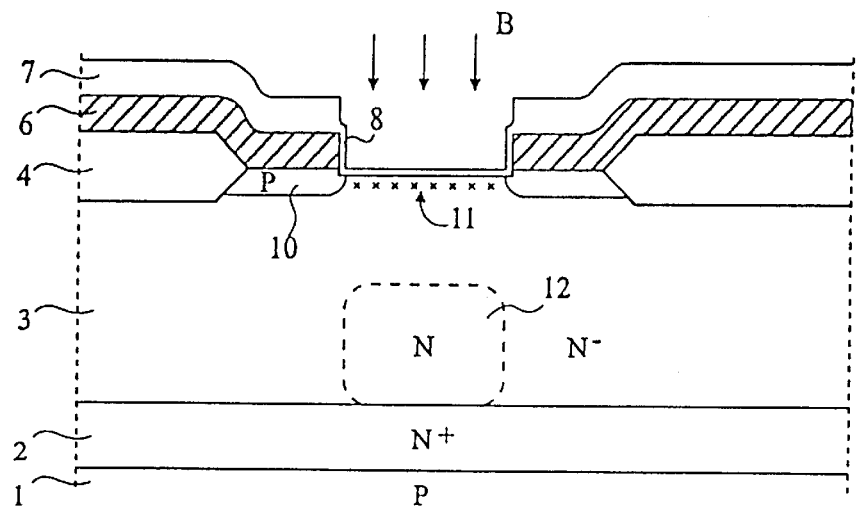
FIGS. 1 to 4 are simplified cross-sectional views of a semiconductor component illustrating successive steps of manufacturing of the emitter-base region of a bipolar transistor.
Figure 2:
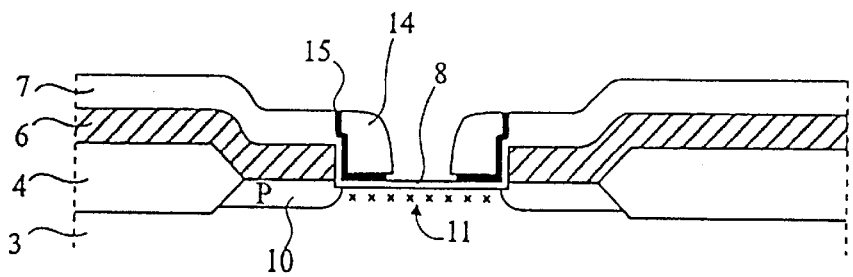

The method according to the present invention starts from the same initial steps as those described and illustrated in relation with FIGS. 1 and 2.

However, at the step of FIG. 1, the P-type dopant dose, designated by reference 30, is chosen to be smaller than the normal dose of formation of the base of a bipolar transistor—for example, an implantation of boron $B^{11}$ at a dose from 0.7 to 1 $10^{13}$ atoms/cm$^2$ instead of an implantation of boron $B^{11}$ at a dose of 3 $10^{13}$ atoms/cm$^2$. Then, after the step of FIG. 2, before removing thin oxide layer 8 above the apparent surface of epitaxial layer 3, a complementary P-type implantation designated by reference 31 is performed, this implantation having this time the dose required to form the base of the bipolar transistor.

Figure 3:
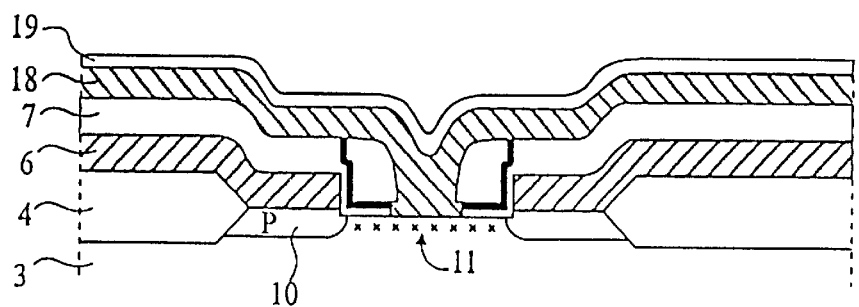
Figure 4:
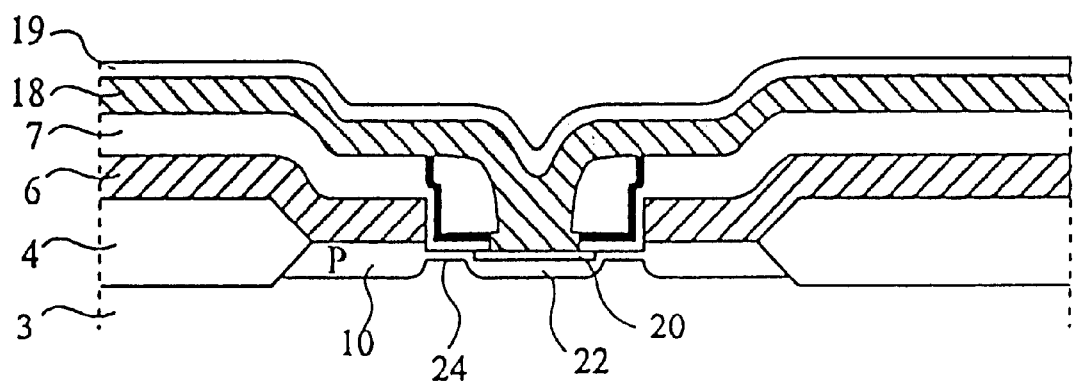
Figure 5:
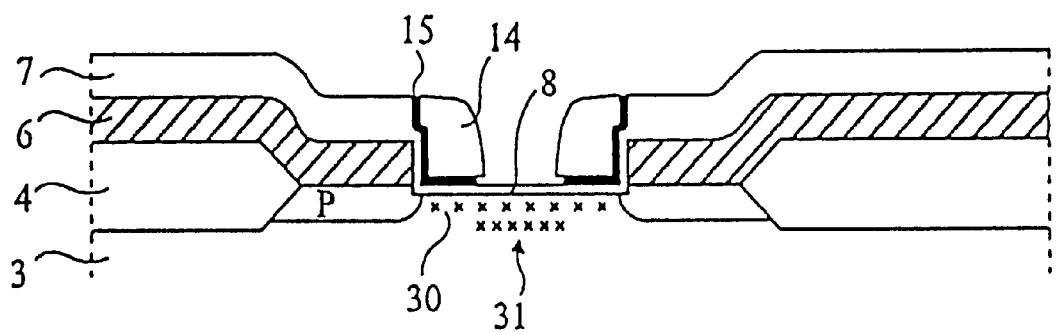
FIGS. 5 and 6 illustrate successive steps of an alternative according to the present invention of the method of FIG. 1 of manufacturing the emitter-base area of a bipolar transistor.

The subsequent steps are the same as those described and illustrated in relation with FIGS. 3 and 4. The result very schematically illustrated in relation with FIG. 6 should however be noted after the fast thermal anneal. Extrinsic base region 10, intrinsic base region 32, and emitter region 20 are substantially the same as those described in relation with FIG. 4. However, intermediary base region 34 is of course less heavily doped than region 24 of FIG. 4 since it results from a smaller implantation Jose. Further, intrinsic base region 32 may be considered, in it; most heavily doped portion, as extending only under emitter region 20 which extends laterally beyond it. Thereby, the intrinsic base implantation, which no longer extends up to the surface along the edges of the emitter region, can be optimized to ensure a high doping gradient without risking adverse affects on the characteristics of the junction periphery. This obtains a transistor with high dynamic range and low noise. It is thus ensured that the emitter-base currents will be much smaller and that the transistor gain will be greater.

Figure 6:
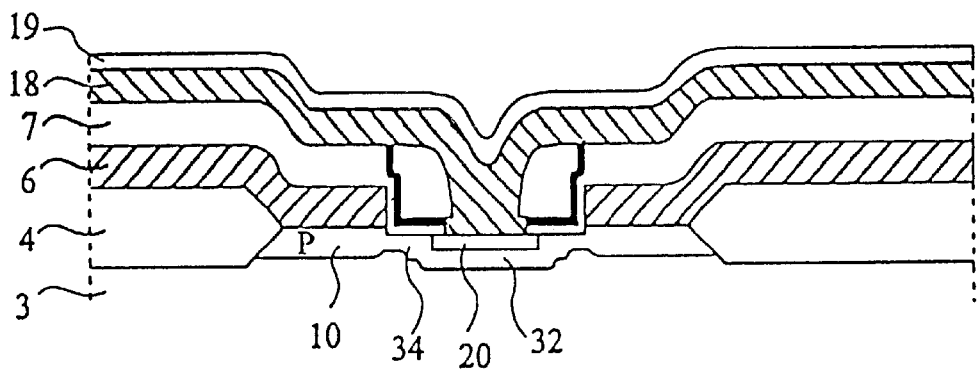
Figure 7:
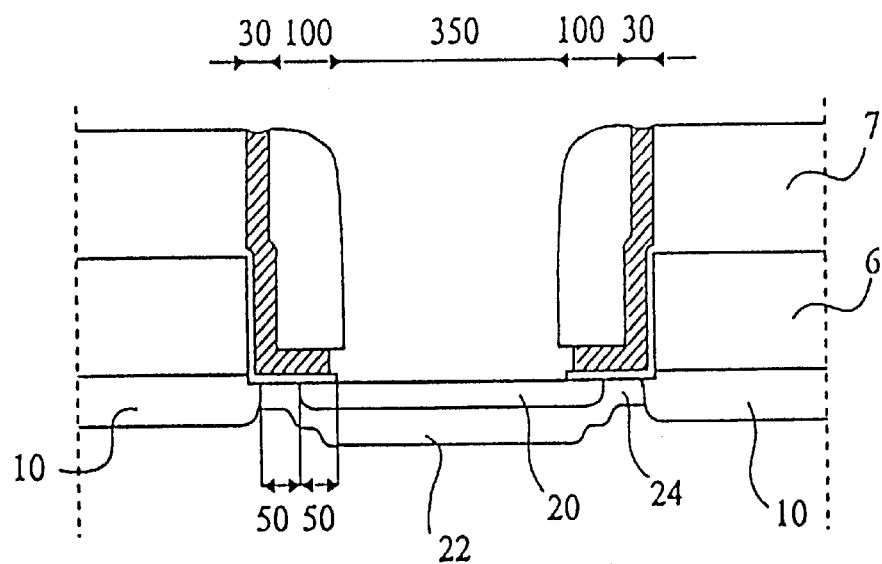
FIG. 7 schematically shows an enlarged portion of the structure of FIG. 6, with indicated examples of dimensions.

FIG. 7 illustrates in an enlarged but further simplified way the central portion of FIG. 6. Examples of dimensions, in nanometers, have been indicated on this drawing. It should be noted that in the illustrated embodiment, the width of the opening in the compound spacer can be 350 nm, the width of the intrinsic base can be 350 nm, and the width of the intermediary base between the intrinsic base and the extrinsic base can be 50 nm only. Preferably, the first implantation, which will correspond to the intermediary phase, is an implantation of boron $B^{11}$ at a dose of 0.7 to 1 $10^{13}$ atoms/cm$^2$ under an energy of 5 keV. The second implantation preferably is a $BF_2$ implantation, which enables obtaining boron atoms which diffuse less, at a dose on the order of 3 to 5 $10^{13}$ atoms/cm$^2$ under a 25 keV energy. The penetration depth of the boron atoms is the same in both cases. The boron fluoride implantation enables, on the one hand, reduction of the diffusion upon annealings and thus obtaining of a high diffusion gradient of the intrinsic base and, on the other hand, since it can be performed at a higher energy, a better control. It should be noted that a single $BF_2$ implantation in the method of the prior art would have further damaged the system since it would have tended to provide an intermediary base area which diffuses even less and which would have been even more concentrated.

Although the present invention has been described in the context of a specific embodiment and of a well defined sequence of steps, it more generally applies to the making of a bipolar transistor of small dimensions. The essential characteristics of the present invention are that an intrinsic base region located completely under an emitter area extending laterally beyond it, an intermediary peripheral area more lightly doped than the intrinsic base region, and a second more heavily-doped extrinsic base peripheral area are provided. The present invention especially applies in the case where the intermediary base area is located under a nitride spacer.

Of course, the present invention is likely to have various alterations, modifications, and improvements which will readily occur to those skilled in the art, as concerns its implementation and its applications. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing base and emitter regions of a bipolar transistor in an active area of a first conductivity type, including the steps of:

depositing a first heavily-doped polysilicon layer of a second conductivity type on the area of a first conductivity type;

eliminating the first heavily-doped polysilicon layer in a central portion thereof;

growing a thermal oxide layer on a first heavily doped polysilicon layer;

performing a first implantation of the second conductivity type in the active area and at a first dose;

forming silicon nitride spacers at an internal periphery of the first polysilicon layer;

performing a second implantation of the second conductivity type in the active are and at a second dose;

eliminating a central portion of the thermal oxide layer;

depositing a second polysilicon layer of the first conductivity type over at least the active area; and performing a fast thermal anneal as the first mad only annealing step;

wherein the second dose is selected to optimize the characteristics of the base-emitter junction and the first dose is smaller than the second dose.

2. The method of claim 1, wherein the first conductivity type is type N and the second conductivity type is type P.

3. The method of claim 1, wherein the first dose results from a boron implantation and the second dose results from a boron fluoride implantation.

4. The method of claim 3, wherein the first implantation is performed at a dose from 0.7 to 1 $10^{13}$ at./cm$^2$ under a 5 keV energy and the second implantation is performed at a dose on the order of 3 to 5 $10^{13}$ at./cm$^2$ under a 25 keV energy.

5. The method of claim 3, wherein the first implantation is performed at a dose from 0.7 to 1 $10^{13}$ at./cm$^2$ under a 5 keV energy.

6. The method of claim 5, wherein the second implantation is performed at a dose on the order of 3 to 5 $10^{13}$ at./cm$^2$ under a 25 keV energy.

7. The method of claim 5, wherein the second implantation is performed at a dose on the order of 3 to 5 $10^{13}$ at./cm$^2$ under a 25 keV energy.

8. The method of claim 3, wherein the second implantation is performed at a dose on the order of 3 to 5 $10^{13}$ at./cm$^2$ under a 25 keV energy.

9. The method of claim 1, wherein the first implantation is performed at a dose from 0.7 to 1 $10^{13}$ at./cm$^2$ under a 5 keV energy.

10. The method of claim 8, wherein the second implantation is performed at a dose on the order of 3 to 5 $10^{13}$ at./cm$^2$ under a 25 keV energy.

11. The method of claim 1, wherein the first dose results from a boron implantation.

12. The method of claim 1, wherein the second dose results from a boron fluoride implantation.

13. The method of claim 1, wherein the internal periphery of the spacers is on the order of 350 nm.

14. The method of claim 1, wherein the diameter of the oxide layer defined by the central portion is on the order of 350 nm.

15. A method of manufacturing base and emitter regions of a bipolar transistor in an active area of a first conductivity type, including the steps of:

depositing a first heavily-doped polysilicon layer of a second conductivity type on the area of a first conductivity type;

eliminating the heavily-doped polysilicon layer in a middle portion thereof;

growing a thermal oxide layer on the first heavily doped polysilicon layer and having a middle portion thereof disposed over said emitter region;

performing a first implantation in said active area, said first implantation being of the second conductivity type and at a first dose;

forming silicon nitride spacers at an internal periphery of the first polysilicon layer;

performing a second implantation in said active area, said second implantation being of the second conductivity type and at a second dose;

eliminating the middle portion of the oxide layer;

depositing a second polysilicon layer of the first conductivity type over at least the active area; and performing a fast thermal anneal;

wherein the second dose is selected to optimize the characteristics of the base-emitter junction and the first dose is smaller than the second dose.

16. The method of claim 15, wherein the first conductivity type is type N and the second conductivity type is type P.

17. The method of claim 15, wherein the first dose results from a boron implantation and the second dose results from a boron fluoride implantation.

18. The method of claim 17, wherein the first implantation is performed at a dose from 0.7 to 1 $10^{13}$ at./cm$^2$ under a 5 keV energy and the second implantation is performed at a dose on the order of 3 to 5 $10^{13}$ at./cm$^2$ under a 25 keV energy.

19. The method of claim 17, wherein the first implantation is performed at a dose from 0.7 to 1 $10^{13}$ at./cm$^2$ under a 5 keV energy.

20. The method of claim 19, wherein the second implantation is performed at a dose on the order of 3 to 5 $10^{13}$ at./cm$^2$ under a 25 keV energy.

21. The method of claim 17, wherein the second implantation is performed at a dose on the order of 3 to 5 $10^{13}$ at./cm$^2$ under a 25 keV energy.

22. The method of claim 15, wherein the first implantation is performed at a dose from 0.7 to 1 $10^{13}$ at./cm$^2$ under a 5 keV energy.

23. The method of claim 22, wherein the second implantation is performed at a dose on the order of 3 to 5 $10^{13}$ at./cm$^2$ under a 25 keV energy.

24. The method of claim 15, wherein the second implantation is performed at a dose on the order of 3 to 5 $10^{13}$ at./cm$^2$ under a 25 keV energy.

25. The method of claim 15, wherein the first dose results from a boron implantation.

26. The method of claim 15, wherein the second dose results from a boron fluoride implantation.

27. The method of claim 15, wherein the internal periphery of the spacers is on the order of 350 nm.

28. The method of claim 15, wherein the diameter of the oxide layer defined by the central portion is on the order of 350 nm.

29. The method of claim 15, wherein the step of performing a fast thermal anneal comprises performing a fast thermal anneal as the first and only annealing step.

* * * * *